(12) United States Patent
Watanabe et al.

(10) Patent No.: US 6,789,250 B2
(45) Date of Patent: Sep. 7, 2004

(54) PATTERN DATA GENERATION SYSTEM, METHOD AND PROGRAM FOR PATTERN DATA GENERATION, RETICLE FABRICATING METHOD, AND SEMICONDUCTOR DEVICE MANUFACTURING METHOD USING THE PATTERN DATA

(75) Inventors: Susumu Watanabe, Kanagawa-ken (JP); Mitsuhiro Yano, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 230 days.

(21) Appl. No.: 10/191,591

(22) Filed: Jul. 8, 2002

(65) Prior Publication Data

US 2003/0009739 A1 Jan. 9, 2003

(30) Foreign Application Priority Data

Jul. 6, 2001 (JP) .................................... P2001-206541

(51) Int. Cl.[7] .............................................. G06F 17/50
(52) U.S. Cl. ........................................ 716/19; 716/21
(58) Field of Search ..................................... 716/19, 21

(56) References Cited

U.S. PATENT DOCUMENTS 6,340,542 B1 * 1/2002 Inoue et al. ................... 430/5
6,370,441 B1 * 4/2002 Ohnuma .................... 700/121
6,560,767 B2 * 5/2003 Toyama et al. ............... 716/21
6,560,768 B2 * 5/2003 Inanami et al. .............. 716/21
6,634,018 B2 * 10/2003 Randall et al. ............... 716/19

FOREIGN PATENT DOCUMENTS

| JP | 2001-092104 | 6/2001 |
|---|---|---|
| JP | 2001-092108 | 6/2001 |

* cited by examiner

*Primary Examiner*—Stacy A. Whitmore
(74) *Attorney, Agent, or Firm*—Gray Cary Ware & Freidenrich LLP (57) ABSTRACT

A chip division information storage unit configured to register chip division information; a chip layout generation unit configured to generate master mask chip layout information by sequentially allotting sub-patterns to a master mask in an order beginning with the largest from the plurality of sub-patterns; a master mask chip layout information storage unit configured to register the master mask chip layout information; a chip pattern data generation unit configured to generate master mask chip pattern data by referencing the reticle chip pattern data and divide each chip in accordance with the master mask chip layout data; a master mask pattern data information storage unit configured to register the master mask chip pattern data; and a pattern data generation unit configured to generate master mask pattern data by referencing the master mask chip layout information and the master mask chip pattern data, are provided.

20 Claims, 7 Drawing Sheets

PATTERN DATA GENERATION SYSTEM, METHOD AND PROGRAM FOR PATTERN DATA GENERATION, RETICLE FABRICATING METHOD, AND SEMICONDUCTOR DEVICE MANUFACTURING METHOD USING THE PATTERN DATA

CROSS REFERENCE TO RELATED APPLICATIONS

This application is based upon and claims the benefit of priority from prior Japanese Patent Application P2001-206541 filed on Jul. 6, 2001; the entirety of which is incorporated by reference herein.

BACKGROUND OF THE INVENTION

1. Field of the Invention

The present invention relates to a pattern data generation system for LSI masks using a computer, a pattern data generation method, a pattern data generation program, and a method of manufacturing semiconductor devices using the pattern data. In particular, it is related to a computer aided mask pattern data generation system for generating master mask pattern data for a photo-repeater; a computer aided mask pattern data generation method; a mask pattern data generation program for controlling the computer aided mask data generation system; a method of fabricating reticles using this master mask, and moreover, a method of manufacturing semiconductor devices using the above.

2. Description of the Related Art

A glass mask (4× magnified mask), or a reticle, that is drawn at 4× magnification relative to the size of the pattern that is to be formed on the actual silicon chip is used during a lithography process used in the LSI manufacturing process. More specifically, after fabricating a set of reticle with a pattern generator, using an exposure system, or a stepper, each of the intended circuit patterns delineated on the reticle is ¼ reduced and transferred onto the silicon wafer. With this lithography method, given that cutting edge LSI design rules at present have become miniaturized to 0.1 $\mu$m or lower, even with the architecture of the 4× mask, highly accurate minute pattern generation has become difficult. As a result, an exceedingly expensive electron beam lithography (EBL) system must be used as the pattern generator used for 4× mask fabrication, which has lead to problems such as the price of masks becoming extremely high.

Therefore, with the aim of breaking through current limits of microfabrication while keeping mask fabrication costs to a minimum, techniques have been proposed to fabricate a master mask, which is a 5× magnification of the 4× mask. The 5× magnification mask can be fabricated with a low-cost popular pattern generator. In other words, a technique reduces this 5× master mask by ⅕ and transferring the image onto a mask substrate. In this case, an exposure system called a photo-repeater is used for pattern generation upon the mask substrate of the conventional 4× mask. The introduction of a photolithographic method using a reticle formed with this photo-repeater into LSI manufacturing methods is being studied. With the above-mentioned photo-repeater, it becomes possible for the master mask used by the photo-repeater to handle mask layout data with 20× (4×x5×) magnification of the actual pattern ultimately applied onto the silicon chip. As a result, even if the design rule for the pattern upon the silicon chip was to be, for example, approximately 0.1 $\mu$m, the processing of approximately 2 $\mu$m can be employed on the master mask to be fabricated. Since the use of a high cost EBL system becomes unnecessary, the problem of microfabrication limits of the pattern generator is avoided. More specifically, since accommodation may be made with a common optical pattern generator due to the significant relaxation of the master mask pattern design rules, reduction in the cost per unit for one reticle is expected.

However, with the above-mentioned photo-repeater, the pattern region of the master mask becomes larger and has an inverse relationship with the reduction ratio. More specifically, when fabricating a master mask with the magnification of 5×, if the pattern region of the reticle is simply divided up, then 5×5=25 master masks become fabricated. And as a result, there are no longer any cost merits. As a result, while means for reducing the number of master masks fabricated have come to be implemented due to worker ingenuity; problems have developed such as the number of master masks fabricated fluctuating and fabrication errors developing due to differences in worker skill.

In addition, in the case where experimental generation results have made design changes necessary, a refined mask (corrected mask) becomes necessary for the redesigned LSI. When fabricating this refined mask, the coordinate values for the redesigned layout data are given to the worker; the worker then finds the pertinent master mask from the coordinate values and refabricates that pertinent master mask. As a result, problems such as increased labor and fabrication errors develop.

Moreover, the refined mask fabrication described above has been carried out with a method that involves refabrication of a master mask having newly pattern layout data that is a combination of only the corrected layout data and the original version of the design data and fabricating only a minimum number of master masks. However, there have been problems with such a method such as the number of master masks used increasing and the operating time of the photo-repeater becoming longer with each subsequent time correction made due to the fact that new configurations of the pattern layout data for the master mask are generated every time corrections develop. In addition, there are further problems such as management of the master masks used becoming difficult.

SUMMARY OF THE INVENTION

A first aspect of the present invention is to provide a pattern data generation system, which includes a) a chip division information storage unit configured to register chip division information of how a chip is divided so that pattern data of enlarged reticle chip pattern data fit into a master mask pattern region; b) a chip layout generation unit configured to generate master mask chip layout information by sequentially allotting sub-patterns to a master mask in an order beginning with the largest from the plurality of sub-patterns configuring the chip division information; c) a master mask chip layout information storage unit configured to register the master mask chip layout information; d) a chip pattern data generation unit configured to generate master mask chip pattern data by referencing the reticle chip pattern data and divide each chip in accordance with the master mask chip layout information; e) a master mask pattern data information storage unit configured to register the master mask chip pattern data; and f) a pattern data generation unit configured to generate master mask pattern data by referencing the master mask chip layout information and the master mask chip pattern data.

A second aspect of the present invention provides a pattern data generation method, which includes a) generating chip division information by performing division processing of a chip pattern so that pattern data of enlarged reticle chip pattern data fit into a master mask pattern region; b) registering the chip division information in a chip division information storage unit; c) generating master mask chip layout information by sequentially allotting sub-patterns to a master mask in an order beginning with the largest from the plurality of sub-patterns configuring the chip division information; d) registering the master mask chip layout information in a master mask chip layout information storage unit; e) generating master mask chip pattern data by referencing the chip pattern data for the reticle and dividing each chip in accordance with the master mask chip layout data; f) registering the master mask chip pattern data in a master mask pattern data information storage unit; and g) generating master mask pattern data by referencing the master mask chip layout information and the master mask chip pattern data.

A third aspect of the present invention provides a pattern data generation program for controlling a pattern data generation system. This program is embraces a) a command for generating chip division information by dividing a chip pattern into a plurality of sub-patterns so that pattern data of enlarged reticle chip pattern data fit into a master mask pattern region; b) a command for registering the chip division information in a chip division information storage unit; c) a command for generating master mask chip layout information by sequentially allotting sub-patterns to a master mask in an order beginning with the largest from the plurality of sub-patterns; d) a command for registering the master mask chip layout information in a master mask chip layout information storage unit; e) a command for generating master mask chip pattern data by referencing the reticle chip pattern data and dividing each chip in accordance with the master mask chip layout data; f) a command for registering the master mask chip pattern data in a master mask pattern data information storage unit; and g) a command for generating master mask pattern data by referencing the master mask chip layout information and the master mask chip pattern data.

A fourth aspect of the present invention provides a reticle fabricating method, which includes a) designing a planar pattern on the surface of a semiconductor chip; b) determining chip pattern data for a number of respective reticles necessary to achieve a planar pattern upon the semiconductor chip; c) generating chip division information by dividing a chip pattern into a plurality of sub-patterns so that pattern data of enlarged chip pattern data for the respective reticles fit into a master mask pattern region; generating master mask chip layout information by selecting a sub-pattern in an order beginning with the largest from the plurality of sub-patterns and sequentially allotting sub-patterns to a master mask; generating master mask chip pattern data by referencing the chip pattern data for the reticle and dividing each chip in accordance with the master mask chip layout data; generating master mask pattern data by referencing the master mask chip layout information and the master mask chip pattern data; d) obtaining a plurality of master masks by respectively patterning a master mask upon a plurality of master mask substrates in accordance with the generated master mask pattern data by a pattern generator; and e) generating the necessary number of respective reticles through the reduction/transcription of the master mask by an exposure system.

A fifth aspect of the present invention provides a semiconductor manufacturing method, which includes a) designing a planar pattern on the surface of a semiconductor chip; b) determining chip pattern data for a necessary number of respective reticles for achieving a planar pattern upon the semiconductor chip; c) generating chip division information by dividing a chip pattern into a plurality of sub-patterns so that pattern data of enlarged chip pattern data for the respective reticles fit into a master mask pattern region; generating master mask chip layout information by selecting a sub-pattern in an order beginning with the largest from the plurality of sub-patterns and sequentially allotting sub-patterns to a master mask; generating master mask chip pattern data by referencing the chip pattern data for the reticle and dividing each chip in accordance with the master mask chip layout data; generating master mask pattern data by referencing the master mask chip layout information and the master mask chip pattern data; d) obtaining a plurality of master masks by respectively patterning a master mask upon a plurality of master mask substrates in accordance with the generated master mask pattern data by a pattern generator; e) generating the necessary number of respective reticles through the reduction/transcription of the master mask by an exposure system; and f) forming a desired microscopic pattern upon a semiconductor substrate through a sequence of manufacturing steps including a selective diffusion step where a diffusion mask is provided through photolithography step using one of the necessary number of reticles is used, and a selective etching step where an etch mask provided through photolithography using another one of the necessary number of reticles.

DETAILED DESCRIPTION OF THE INVENTION

An embodiment of the present invention is described forthwith while referencing the drawings. In the following description of the drawings, the same or similar elements are assigned the same or similar reference markers. Nevertheless, the drawings are schematic and therefore it should be noted that proportionate relationships among the various measurements may differ from real conditions. Accordingly, specific measurements and the like should be decided upon taking into consideration the following description. In addition, there are naturally portions included having relationships and ratios among the measurements that vary between each of the respective drawings.

(Chip Division)

Figure 1:
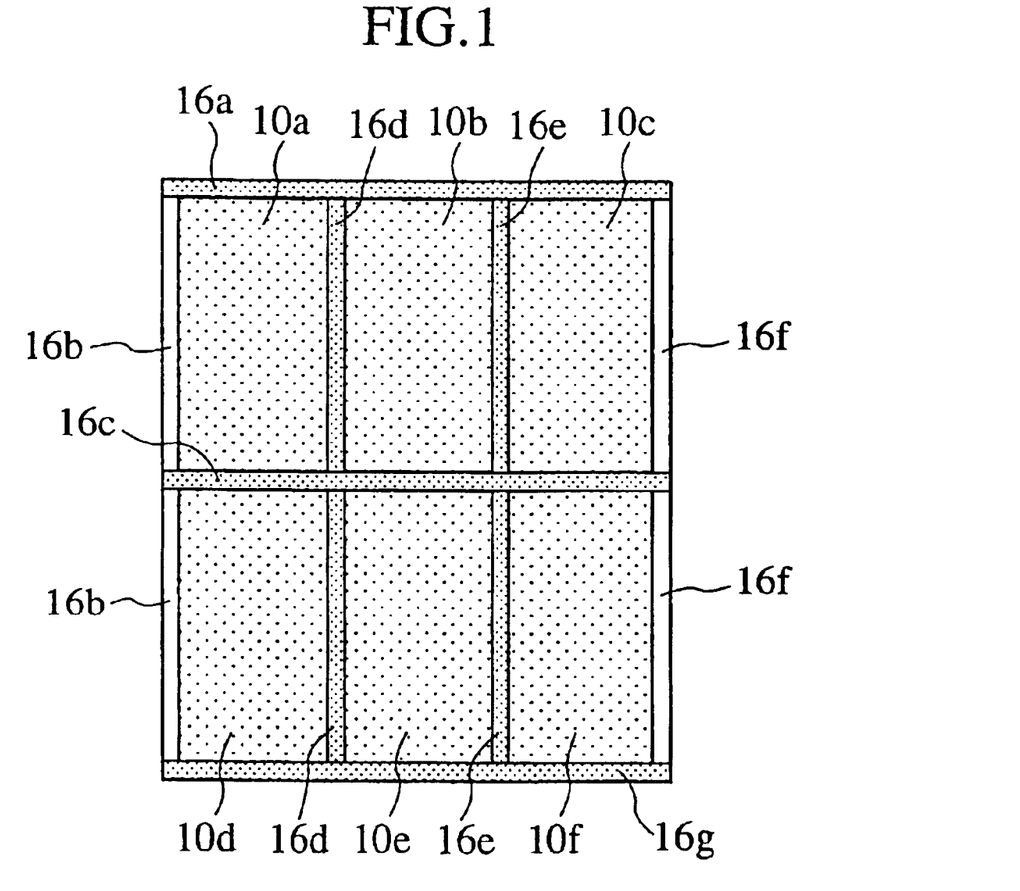
FIG. 1 is a diagram showing an example of a configuration of a pattern for a multi-chip mask.

FIG. 1 is a drawing showing an example of the structure of a pattern for a multi-chip mask delineated on a reticle. Here, the multi-chip mask means a mask having the same chip patterns arranged in plural upon the same reticle. In order to effectively perform patterning using the entire mask pattern region as ensured by the optical lenses of a stepper that reduces (normally by ¼ or ⅕) and transfers upon a silicon wafer, a reticle where a plurality of patterns corresponding to an LSI chip are delineated on a mask substrate is fabricated. In the following, the pattern corresponding to one of the LSI chips is simply referred to as "chip". As shown in FIG. 1, in this example, the multi-chip mask pattern is implemented by six identical chips 10a, 10b, . . . , 10f, and seven strip regions called as "kerfs" 16a, 16b, . . . , 16g. Each of the kerfs 16a, 16b, . . . , 16g embraces various test element group (TEG), whereupon.

Figure 2:
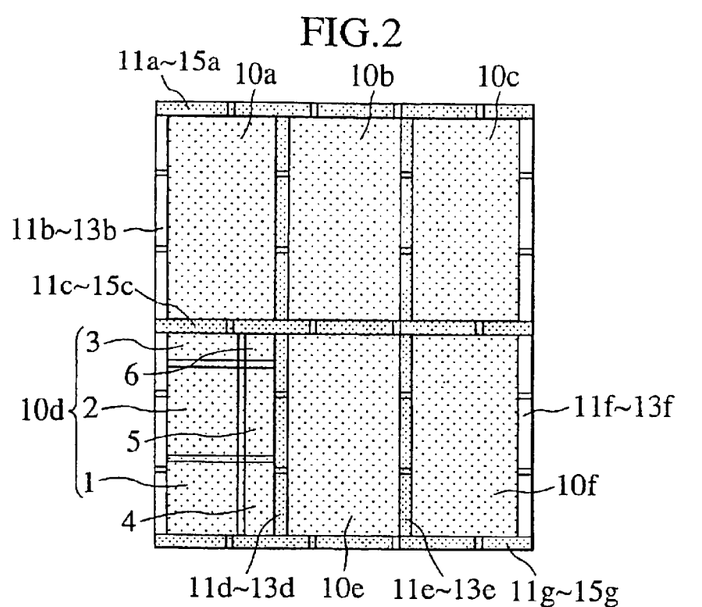
FIG. 2 is a diagram showing an example chip of division of the chip pattern of FIG. 1.

FIG. 2 is a diagram showing an example of chip division topology, focusing on a multi-chip mask of chip 10d. If each chip size of the reticle shown in FIG. 1 were to be enlarged 5×, since that size would be greater than the pattern region of the master mask, as shown in FIG. 2, in order to fit the pattern region of the master mask, the pattern of chip 10d is divided into sub-patterns 1, 2, . . . , 6. Dummy strips each having widths of approximately 1 mm are provided on the boundary lanes, by the center line of which the chip 10d is divided. The dummy strips are provided such that peripheral patterns disposed in the exposure field and near the dummy strips can be delineated accurately, using the dummy strips as the marginal fields when exposing the exposure field by the photo-repeater, defining the exposure field through an orifice. Moreover, as shown in FIG. 2, the kerfs 16a, 16b, . . . , 16g shown in FIG. 1 are also divided into 11a through 15a, 11b through 13b, 11c through 15c, 11d through 13d, 11e through 13e, 11f through 13f, 11g through 15g, . . . and the like.

Figure 3A:
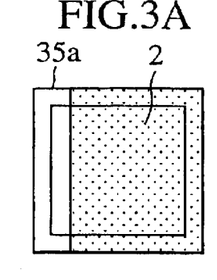
FIGS. 3A through 3H are diagrams showing an example of the structure of patterns for master masks generated using a pattern data generation method according to an embodiment of the present invention.
Figure 3B:
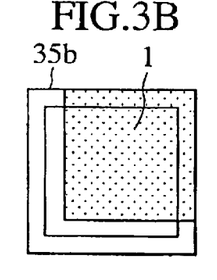
Figure 3C:
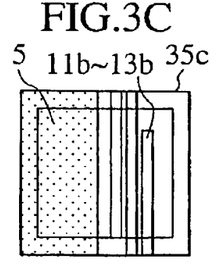
Figure 3D:
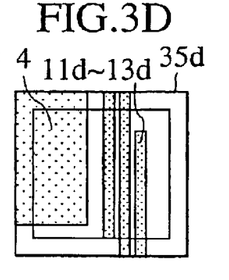
Figure 3E:
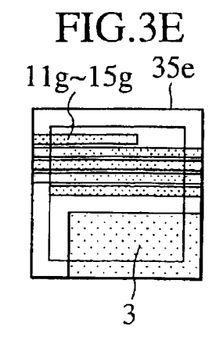
Figure 3F:
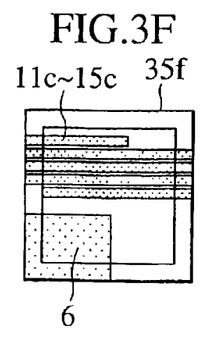
Figure 3G:
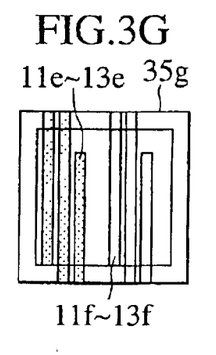
Figure 3H:
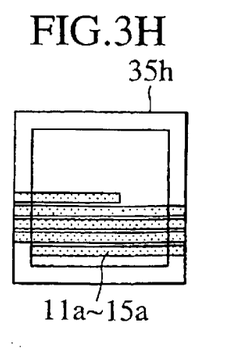

FIGS. 3A through 3H are diagrams showing an example of the structure of the pattern for a multi-chip mask. The sub-patterns are assigned from the sub-patterns 1, 2, . . . , 6, 11a, 12a, . . . , 15a, 11b, 12b, 13b, 11c, 12c, . . . , 15c, 11d, 12d, 13d, 11e, 12e, 13e, 11f, 12f, 13f, 11g, 12g, . . . , 15g shown in FIG. 2 in an order beginning with the largest among the eight master masks 35a, 35b, . . . , 35h to form the pattern of the master mask. FIG. 3A generates a master mask pattern by assigning sub-pattern 2 to the master mask 35a. FIG. 3B generates a master mask pattern by assigning sub-pattern 1 to the master mask 35b. FIG. 3C generates a master mask pattern by assigning sub-patterns 5 and 11b through 13b to the master mask 35c. FIG. 3D generates a master mask pattern by assigning sub-patterns 4 and 11d through 13d to the master mask 35d. FIG. 3E generates a master mask pattern by assigning sub-patterns 3 and 11g through 13g to the master mask 35e. FIG. 3F generates a master mask pattern by assigning sub-patterns 6 and 11c through 15c to the master mask 35f. FIG. 3G generates a master mask pattern by assigning sub-patterns 11e through 13e and 11f through 13f to the master mask 35g. FIG. 3H generates a master mask pattern by assigning sub-patterns 11a through 15a to the master mask 35h.

(Pattern Data Generation System)

Figure 4:
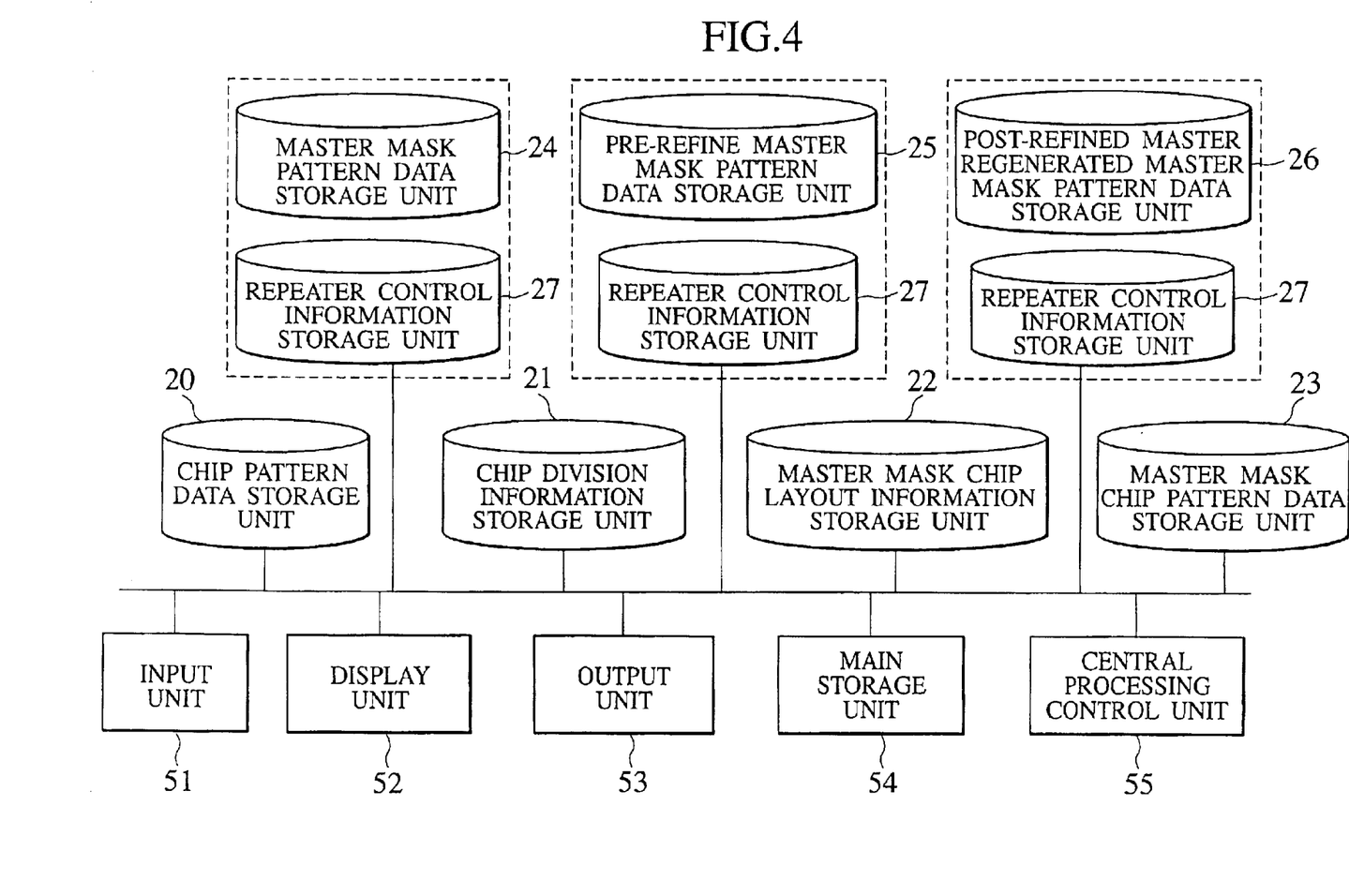
FIG. 4 is a functional block diagram of a pattern data generation system according to an embodiment of the present invention.

The pattern data generation system according to an embodiment of the present invention, as shown in FIG. 4, is a CAD system encompassing an input unit 51, a display unit 52, an output unit 53, a main storage unit 54, a chip pattern data storage unit 20, a chip division information storage unit 21, a master mask chip layout information storage unit 22, a master mask chip pattern data storage unit 23, a master mask pattern data storage unit 24, a pre-refine master mask pattern data storage unit 25, a post-refined regeneration master mask pattern data storage unit 26, a repeater control information storage unit 27, and a central processing control unit 55. The chip pattern data storage unit 20 registers chip pattern data for the reticles (4× masks); more specifically, it registers data such as the pattern data and chip size for the chip pattern of each reticle. The chip division information storage unit 21 has chip division information already registered; more specifically, it registers information such as sub-patterns for each chip. The master mask chip layout information storage unit 22 registers chip layout information for the master masks. The master mask chip pattern data storage unit 23 registers chip pattern data for the master masks. Master mask pattern data has already been registered in the master mask pattern data storage unit 24; more specifically, data for patterns such as those shown in FIGS. 3A through 3H is registered. The pre-refine master mask pattern data storage unit 25 registers the pre-refine master mask pattern data. The post-refined master mask pattern data storage unit 26 registers the post-refined master mask pattern data. The repeater control information storage unit 27 has already registered information such as a mask identification number, master mask region to be exposed, and the exposure locations of the reticles (4× masks); more specifically, information used for exposure generation of reticles (4× masks) from the eight master masks 35a, 35b, . . . , 35h as shown FIGS. 3A through 3H with a photo-repeater.

Figure 5:
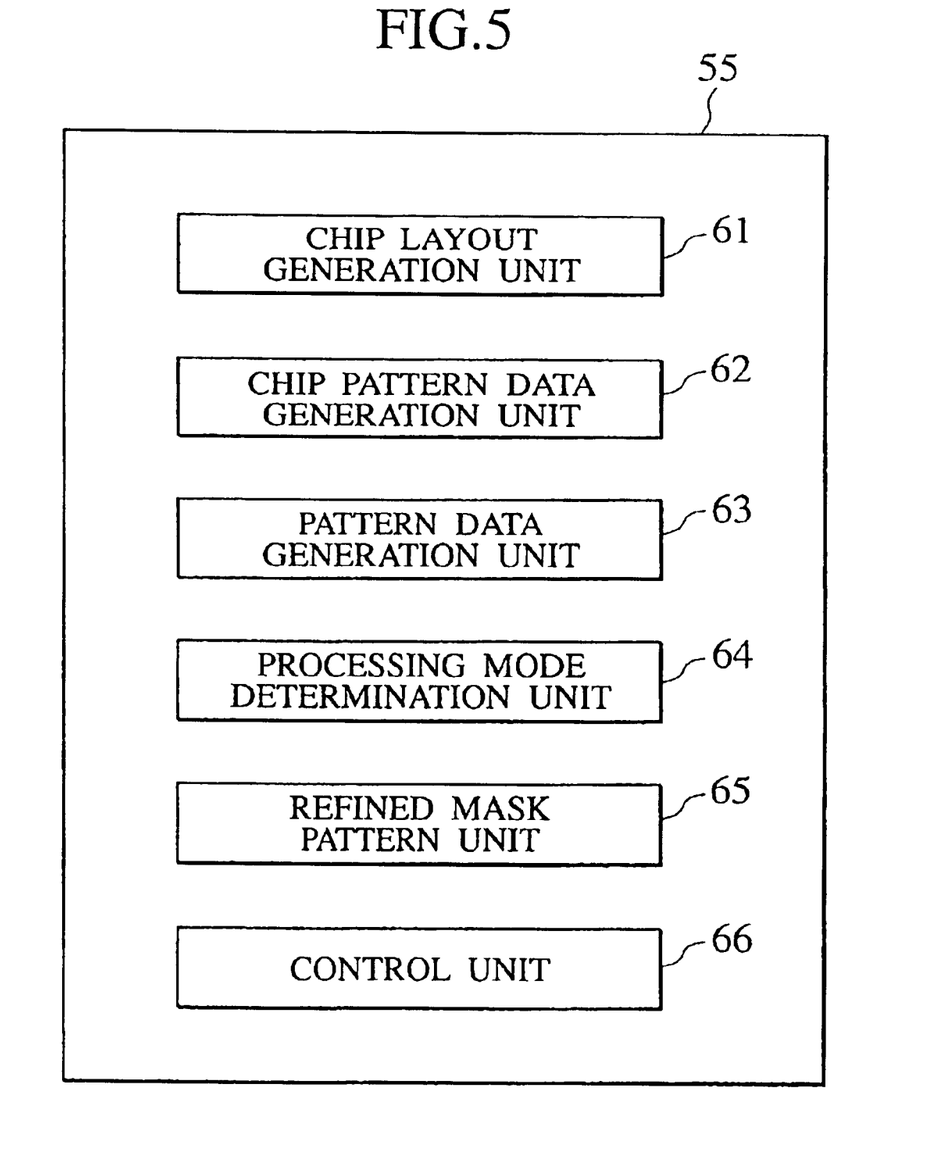
FIG. 5 is a functional block diagram of a central processing control unit of a pattern data generation system according to an embodiment of the present invention.

The central processing control unit 55 is a central processing unit configured to perform the processing of a mask pattern data generation system. While not shown in FIG. 4, the central processing control unit (CPU) 55, as shown in FIG. 5, encompasses a chip layout generation unit 61, a chip pattern data generation unit 62, a pattern data generation unit 63, a processing mode determination unit 64, and a refined mask pattern unit 65. The chip layout generation unit 61 is configured to generate master mask chip layout information. The chip pattern data generation unit 62 is configured to generate master mask chip pattern data. The pattern data generation unit 63 is configured to generate master mask pattern data. The processing mode determination unit 64 is configured to determine the processing mode. The refined mask pattern unit 65 is configured to generate master mask pattern data. Moreover, as shown in FIG. 4, the central processing control unit 55 encompasses a control unit 66, which controls the respective input/output of the input unit 51, the display unit 52, the output unit 53, the main storage unit 54, the chip pattern data storage unit 20, the chip division information storage unit 21, the master mask chip layout information storage unit 23, the master mask pattern data storage unit 24, a pre-refine master mask pattern data storage unit 25, the post-refined regeneration master mask pattern data storage unit 26, and the repeater control information storage unit 27.

The input unit 51 encompasses, for example, a keyboard, mouse, and/or voice device. The display unit 52 encompasses, for example, a liquid crystal display, or CRT display. The output unit 53 encompasses, for example, an ink-jet printer or laser printer. The main storage unit 54 is incorporated with RAM and ROM. ROM functions as, for example, program memory, which stores a program for execution with the central processing control unit 55. RAM functions as, for example, data memory, which stores data to be used during program execution processing with the central processing control unit 55 and is utilized as a working region.

As described in the above, with the pattern data generation system of the present invention, microscopic dimensions of reticle may be fabricated with a low-cost pattern generator, and it may become possible to minimize the number of master masks necessary for this reticle production.

(Pattern Data Generation Method)

Figure 6:
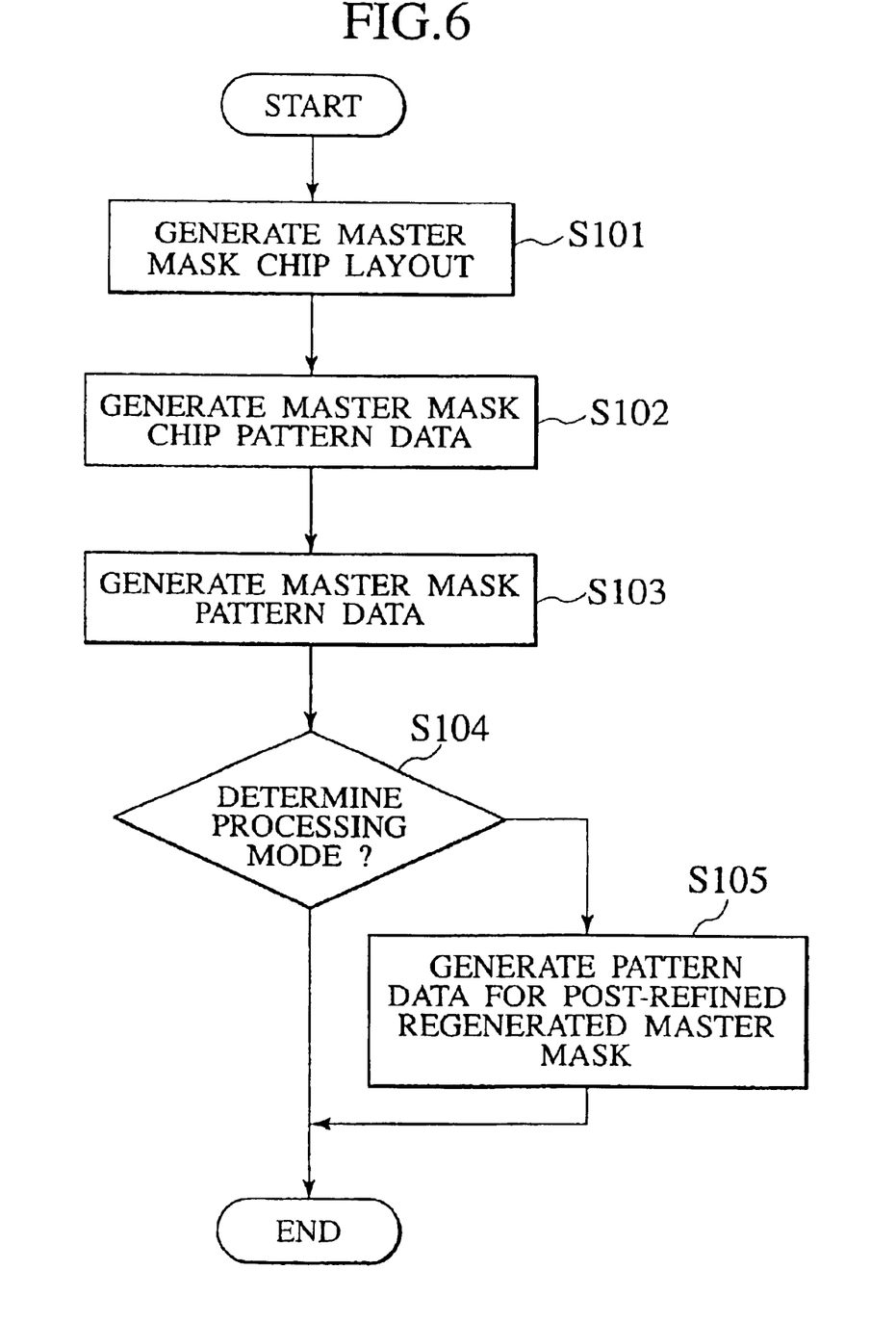
FIG. 6 is a flowchart of a pattern data generation method according to an embodiment of the present invention.

Next, with reference to FIG. 6, processing is described for a pattern data generation method according to an embodiment of the present invention.

(a) In Step S101, the central processing control unit 55 of the pattern data generation system uses the chip layout generation unit 61 shown in FIG. 5 to generate master mask chip layout information that minimizes the number of master masks, and stores this in the master mask chip layout information storage unit 22. In order to generate this master mask chip layout information, to begin with, reading of the chip pattern data storage unit 20 is directed via the input unit 51. Here, the chip layout generation unit 61, as shown in FIG. 2, reads in from the chip pattern data storage unit 20 each chip size for the chip pattern data of the 4× masks (reticles) as input data. Then, in order for this 5× pattern data, which is each piece of chip pattern data for the 4× masks (reticles) further subjected to 5× magnification, to fall within the size of the master mask pattern region, a plurality of sub-patterns 1 through 6 are formed to generate chip division information. After reorganizing the sub-patterns 1 through 6 in order of size, the chip layout generation unit 61 stores this in the chip division information storage unit 21. The sub-patterns are then read out in an order beginning with the largest from the chip division information stored in the chip division information storage unit 21, and as shown in FIGS. 3A through 3H, applies this to the first master mask 35*a*. After allocation of the first (largest) sub-pattern to the master mask 35*a*, in the case where there are blank regions including the dummy region in the master mask 35*a*, the next largest sub-pattern is made a candidate, the chip division information is read out from the chip division information storage unit 21, and allocation to the blank region is attempted. In the case where it does not completely fit into a blank region of master mask 35*a*, the next largest sub-pattern is made a candidate, read out from the chip division information storage unit 21, and is attempted to be applied to a blank region. Here, the sub-pattern that has already been applied to the master mask 35*a* is deleted from the chip division information storage unit 21. Processing such as the above is sequentially repeated for the second master mask 35*b* and the third master mask 35*c*. Once all of the sub-patterns are made candidates and attempted for each of the master masks 35*a*, 35*b*, . . . , 36*h*, and even if the blank regions have not been filled up, processing for applied to the master masks is ended. As a result, chip layout information for the master masks 35*a*, 35*b*, . . . , 35*h* as shown in FIGS. 3A through 3H is completed. Chip layout information generated by the chip layout generation unit 61 is registered in the master mask chip layout information storage unit 22. It should be noted that the master mask chip layout generation is described later on in further detail.

(b) Next, in Step S102, the chip pattern data generation unit 62 shown in FIG. 5 reads out each piece of chip pattern data for the 4× masks (reticles) from the chip pattern data storage unit 20. Then, in accordance with the chip layout data registered in the master mask chip layout information storage unit 22, the chip pattern data generation unit 62 generates chip pattern data for the master masks 35*a*, 35*b*, . . . , 35*h* and registers this in the master mask chip pattern data storage unit 23.

(c) Next, in Step S103, the pattern data generation unit 63 generates master mask pattern data and repeater control information from the master mask chip layout information registered in the master mask chip layout information storage unit 22 and the chip data pattern data registered in the master mask chip pattern data storage unit 23. Then, the pattern data generation unit 63 registers the master mask pattern data and the repeater control information in the master mask pattern data storage unit 24 and the repeater control information storage unit 27, respectively. FIGS. 3A through 3H are diagrams showing an example of the structure of the pattern for a multi-chip mask. As shown in FIGS. 3A through 3H, the sub-patterns 1, 2, . . . , 6, 11*a*, 12*a*, . . . , 15*a*, 11*b*, 12*b*, 13*b*, 11*c*, 12*c*, . . . , 15*c*, 11*d*, 12*d*, 13*d*, 11*e*, 12*e*, 13*e*, 11*f*, 12*f*, 13*f*, 11*g*, 12*g*, . . . , 15*g* in FIG. 2 are applied to the eight master masks 35*a*, 35*b*, . . . , 35*h* to generate the master mask patterns. The pattern data generation unit 63 generates master masks using the master mask pattern data stored in this master mask pattern data storage unit 24 and the repeater control information stored in the repeater control information storage unit 27.

(d) In Step S104, the processing mode determination unit 64 determines the processing mode, either master mask pattern generation for a pre-designated initial mask or master mask pattern data generation for a refined mask. Here, in the case of the initial mask processing mode, processing ends; meanwhile, in the refined mask processing mode, processing moves to Step S105.

(e) In step S105, the refined mask pattern unit 65 compares the master mask pattern data registered in master mask pattern data storage unit 24 and the pre-refine master mask pattern mask data registered in the pre-refine master mask pattern data storage unit 25 for each master mask. Then, the refined mask pattern unit 65 extracts only the differing master mask pattern data from the master mask pattern data storage unit 24, and makes this a refined mask. This is then output as post-refined regenerated master mask pattern data, and registered in the post-refined regenerated master mask pattern data storage unit 26 completing the processing. With a pattern data generation method such as that described above, the number of masks that will be fabricated can be minimized.

In addition, at the time of refined mask generation during LSI redesign, since the pattern data is generated by determining through automation the master mask corresponding to the corrected layout data vis-à-vis the initial design data, the emergence of errors due to mistakes by workers that have occurred conventionally may be eliminated.

Moreover, even at the time of refined mask generation, since the master mask with the pattern layout data configuration from the time of the initial version is generated, even if the number of times refinements are made were to increase, the number of master masks used does not increase, and mask management may be simplified.

Figure 7:
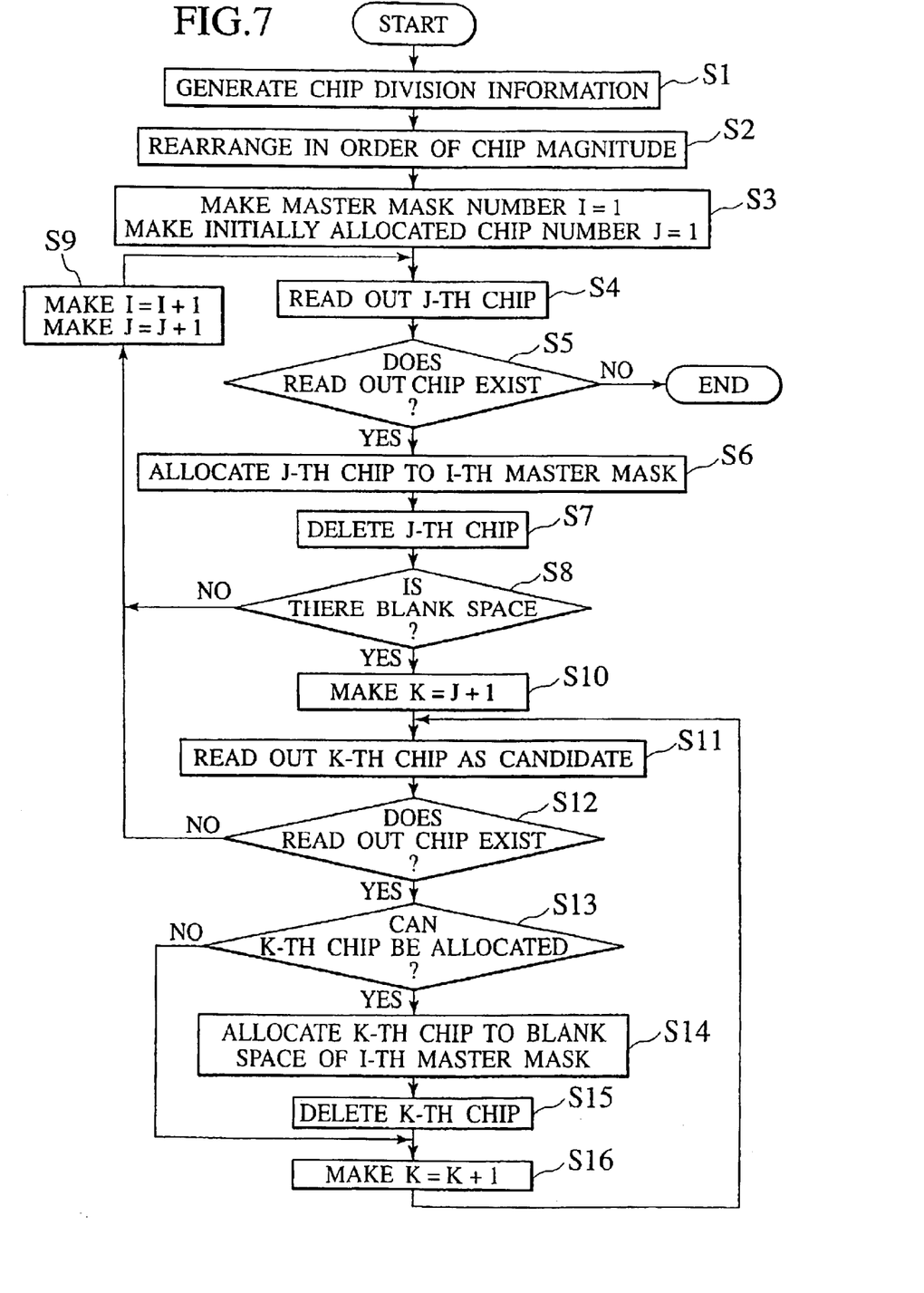
FIG. 7 is a flowchart showing the contents of master mask chip layout generation processing with a pattern data generation method according to an embodiment of the present invention.

Next, with reference to FIG. 7, master mask chip layout processing in Step S101 of FIG. 6 is described in more detail.

(a) To begin with, in Step S1, the chip layout generation unit 61 of the pattern data generation system sequentially reads out reticle chip pattern data from the chip pattern data storage unit 20 for all of the chips 10, 10*b*, . . . , 10*f* of the 4× masks (reticles), which are input data shown in FIG. 1. Then, in order for this 5× magnified pattern data, which is the chip pattern data for the reticles that has been subjected to 5× magnification, to fall within the size of the master mask pattern region, the pattern for each chip is divided into a plurality of sub-patterns to generate chip division information, and this is sequentially registered in the chip division information storage unit 21. The chip division of each chip is carried out, for example, in a manner such as the sub-patterns 1 through 6, as shown in FIG. 2. Then, in step S2, the chip layout generation unit 61 performs rearrangement of the chip information registered in the chip division information storage unit 21 so that the sub-patterns can be sequentially readout in an order beginning with that with the highest value using the surface area, width, height, and the like of each sub-pattern as keys.

(b) Next, in Step S3, the chip layout generation unit 61 initializes the master mask number I and the chip number J. In Step S4, the chip layout generation unit 61 reads out the J-th sub-pattern to be initially allocated, from the chip division information storage unit 21. Here, if the J-th sub-pattern has already been deleted by the Step S7 or S15, which are described below, the J-th or a later non-deleted sub-pattern is read out, and the sub-pattern number J is changed to the registration number of the read-out sub-pattern. In Step S5, the existence of the read-out sub-pattern in the processing of Step S4 is determined. Here, if the read-out sub-pattern does not exist in the chip division information storage unit 21, processing ends. However, if the read-out sub-pattern does exist in the chip division information storage unit 21, processing moves to that in Step S6.

(c) In Step S6, the chip layout generation unit 61 allocates the read-out initially allocated J-th sub-pattern to the I-th master mask and registers this in the master mask chip layout information storage unit 22. In Step S7, the chip layout generation unit 61 deletes the J-th sub-pattern, which is now allocated to a master mask, from the chip division information storage unit 21.

(d) In Step S8, the chip layout generation unit 61 determines whether there is a blank region on the I-th master mask, onto which the initially allocated J-th sub-pattern is allocated. In the case where there is not a blank region in the master mask, processing moves to that in Step S9; however, if there is a blank region in the master mask, then processing moves to that in Step S10. In Step S9, the chip layout generation unit 61 increments the master mask number I and the initially allocated sub-pattern number J by 1 and returns to the processing of Step S4. In Step S10, in the initialization processing of the combination candidate sub-pattern number K, the initially allocated divided number is made J+1.

(e) In Step S11, the chip layout generation unit 61 reads out the combination candidate K-th sub-pattern from the chip division information storage unit 21. Here, if the K-th sub-pattern has already been deleted, the chip layout generation unit 61 reads out the K-th or a later non-deleted sub-pattern, and changes the combination candidate sub-pattern number K to the registration number of the read out sub-pattern. In Step S12, the existence of the read-out sub-pattern in the processing of Step S11 is determined. If the read-out sub-pattern does not exist in the chip division information storage unit 21, processing moves to that Step S9. However, if the read-out sub-pattern does exist in the chip division information storage unit 21, processing moves to Step S13.

(f) In Step S13, the chip layout generation unit 61 determines whether or not the combination candidate K-th sub-pattern can be allocated to a blank region on the I-th master mask. In the case where it is impossible to allocate into the blank region, processing moves to Step S16; when allocation into the blank region is possible, processing moves to Step S14. In Step S14, the chip layout generation unit 61 allocates the K-th sub-pattern to the blank region of the I-th master mask, and registers this in the master mask chip layout information 12.

(g) In Step S15, the chip layout generation unit 61 deletes the K-th sub-pattern, which is now allocated to a master mask, from the chip division information storage unit 21. In Step S16, the chip layout generation unit 61 increments the candidate sub-pattern number K by 1 and returns to the processing in Step S11 to allocate the next candidate sub-pattern.

(Pattern Data Generation Program)

Next, the executable commands of the pattern data generation program for controlling the pattern data generation system are described in detail.

The pattern data generation program encompasses (a) a command for generating chip division information by dividing a chip pattern into a plurality of sub-patterns in order for the expanded pattern data to fit the pattern region of the master mask;

(b) a command for registering that chip division information into the chip division information storage unit;

(c) a command for generating master mask chip layout information by sequentially allotting sub-patterns from this chip division information beginning with the largest sub-pattern;

(d) a command for registering this chip layout information into the master mask chip layout information storage unit;

(e) a command for generating master mask chip pattern data by dividing each chip in accordance with the master mask chip layout information while referencing the chip pattern data of the reticles;

(f) a command for registering the chip pattern data of the master mask into the master mask pattern data storage unit; and (g) a command for generating master mask pattern data while referencing the master mask chip layout information and the master mask chip pattern data.

Moreover, the above-mentioned command for generating master mask chip pattern data may encompass a sub-command for generating chip division information by reading each chip size of the chip pattern data of the reticle as input data and dividing each chip into a plurality of sub-patterns in order to make each of those chip sizes of a size which allows the enlarged pattern fit the pattern region of the master mask;

a sub-command for allocating to each master mask by sequentially reading out from the chip division information beginning with the largest sub-pattern after rearranging this chip division information by size of sub-pattern; and a sub-command for reading out from the chip division information the next largest sub-pattern as a candidate and attempting to allocate it to the blank region in the case where there is a blank region in the master mask including the dummy region after allocating the first sub-pattern to the master mask, and then in the case where it does not completely fit into the blank region of the master mask, reading out the next largest sub-pattern as a candidate from the chip division information and attempting to allocate it to the blank region.

A pattern data generation program such as the above for controlling the pattern data generation system may be saved on a computer-readable storage means. The above-mentioned pattern data generation system may be implemented by computer control to read in this storage media and run the pattern data generation program. Here, storage media means any media that may be capable of storing a program such as an external memory device of a computer, semiconductor memory, magnetic disk, optical disk, magneto-optical disk, or magnetic tape. More specifically, storage media may include, for example, a floppy disk, CD-ROM, MO disk, cassette tape, or open-reel tape.

As it has been described in the above, with the pattern data generation program according to the present invention, a reticle having microscopic dimensions may be fabricated with a low-cost pattern generator, and the number of master masks necessary for this reticle fabrication may be minimized.

(Semiconductor Device Manufacturing)

Figure 8:
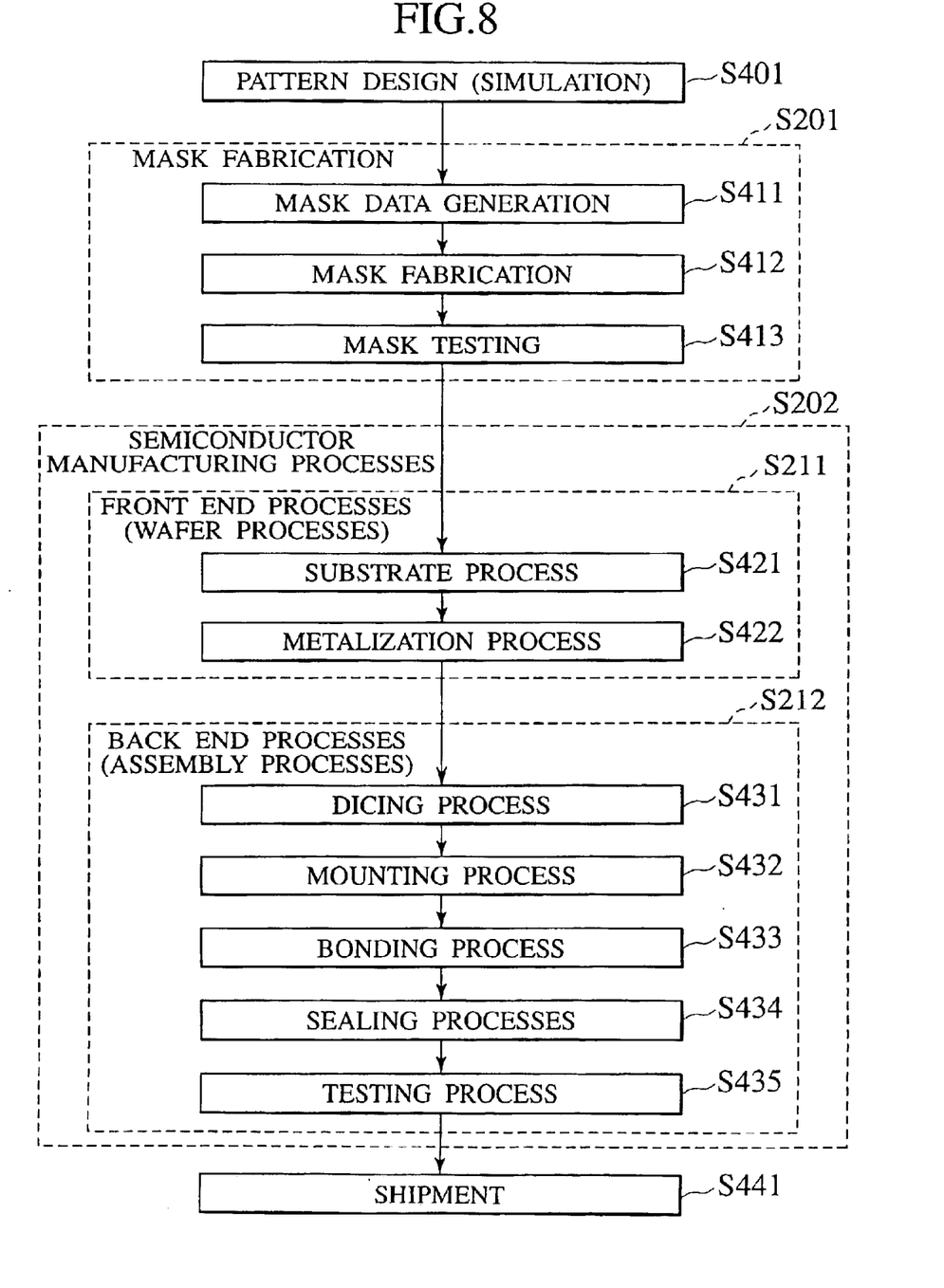
FIG. 8 is a flowchart showing a method of manufacturing a semiconductor device according to an embodiment of the present invention.

Next, with reference to FIG. 8, a method for manufacturing semiconductor device, which uses the above-mentioned pattern data generation system and the pattern data generation method, is described. The method for manufacturing semiconductor device according to the present invention, as shown in FIG. 8, embraces a pattern design process in Step S401, a mask fabrication process in Step S201, and a semiconductor manufacturing process in Step S202. The pattern design process in Step S401 involves simulation processes such as process simulation, device simulation, and circuit simulation. The semiconductor manufacture process in Step S202 embraces the front end processes (wafer processes) of Step S211 for building in an integrated circuit upon a silicon wafer, and the back end processes (assembly processes) of Step S212 from dicing to testing. In the following, each process is described in detail.

(a) To begin with, in Step S401, based on the requested specifications, process simulation is performed, to determine the planar shape/cross-sectional geometry as well as impurity concentrations and the like of the semiconductor device. Next, device simulation is performed from the results of the process simulation and each value of the electric current/voltage input to each electrode. Circuit simulation is further performed using the electrical characteristics obtained from this device simulation and the circuit layout is determined.

(b) In Step S411, Mask data for the number of masks necessary for bringing about an LSI surface pattern using a CAD system is generated based on the circuit layout performed through the circuit simulation. To begin with, taking into consideration differences in pattern conversion during the etching process and/or the size of the spread of the diffusion region during the diffusing process, a set of mask patterns necessary for bringing about a surface pattern upon an actual semiconductor chip is designed. The number of masks fabricated may be anywhere from ten to several tens or even greater depending on the processes and the details of the semiconductor integrated circuit. Namely, the necessary pattern data for the reticles are respectively determined depending on each respective layer and the respective internal structures of the semiconductor chip. Moreover, the 5× master mask pattern data is determined for the respective chip pattern data for these reticles. Here, as described using the flowcharts in FIG. 6 and FIG. 7, the pattern data generation system (or the CAD system) of the present invention generates master mask pattern data that minimizes the number of master masks for each reticle pattern to generate the 5× master mask pattern data. Through the generation of the 5× master mask pattern data, it may become possible to handle 20× (4××5×) magnified mask layout data relative to the final pattern measurements upon the silicon chip.

(c) Next, in Step S412, the pattern data of the generated 5× master mask is input to a storage unit of a popular pattern generator that uses, for example, an optical exposure method. The pattern generator then reads out the master mask pattern data stored in the storage unit and patterns the 5× master mask upon a substrate for the master mask. This 5× master mask is reduced by ⅕ and transferred upon a reticle mask substrate fabricating a 4× mask (reticle). In this case, an exposure system called a photo-repeater is used in order to array chips in plural at fixed intervals in a manner such as the reticle masks upon the mask substrate shown in FIG. 1. Once a predetermined number of masks are fabricated, mask testing is carried out in Step S413. Then if it is determined that the predetermined masks have passed the mask testing, processing proceeds to Step S421.

(d) Next, in Step S421, substrate processes are carried out on a semiconductor wafer by repeating lithographic processes using the respective reticle necessary for each process. For example, selective diffusion processes and/or selective ion implantation processes are carried out using a diffusion mask that delineates the photoresist applied upon the semiconductor wafer through the use of a corresponding reticle by a stepper. Moreover, each type of thin film formed with an oxidization process or chemical vapor deposition (CVD) process is subjected to etching using an etching mask such as a photo resist mask formed by a stepper using another corresponding reticle. Then, in Step S422, metalization processing (surface interconnect process) is employed on the substrate surface by patterning a predetermined pattern with a stepper using the necessary reticle for each process in the same manner. In the metalization process of Step S422, insulation film deposition using a CVD process, and metal layer deposition processes using vacuum evaporation or sputtering are repeated. For example, an etching mask comprising a photo resist may be formed by exposure with a stepper using the corresponding reticle fabricated in Step S201. Then through a selective etching process such as reactive ion etching (RIE) using this etching mask, formation of contact holes in an insulation layer and patterning of a metal layer is performed.

(e) Once the front end processes (wafer processes) are completed, in Step S431, dicing into a predetermined chip size is performed (dicing process) with a dicing system such as a diamond blade. Then, in Step S432, mounting onto a packaging material such as a metal or ceramics is performed (mounting process), and in Step S433, the electrode pads upon the chip and the leads of the lead frame are connected with metal wires (bonding process). Next, in Step S434, a predetermined package assembly process such as plastic molding is employed. Then, in Step S435, the semiconductor device is completed after predetermined testing (testing process) such as characteristics testing relating to performance and functionality of the semiconductor device, testing of lead shape and measurement conditions, and reliability testing.

(f) In Step S441, a semiconductor device that has cleared all of the above processes is encapsulated to protect against moisture and static electricity and shipped out.

As it has been described in the above, with the reticle fabricating method and the semiconductor device manufacturing method according to the present invention, a reticle having microscopic dimensions may be fabricated with a low-cost pattern generator, and the number of master masks necessary for this reticle fabrication may be minimized.

Accordingly, according to the present invention, reticles necessary for lithographic processes in the deep sub micron to nanometer levels may be fabricated at low costs, and the manufacturing cost of a semiconductor device as a product may be reduced.

In the preceding, the present invention is described in detail through an embodiment; however, it is obvious to those with ordinary skill in the art that the present invention is not meant to be construed as being limited by the description of this embodiment in this application. The device of the present invention may be implemented with various improvements and modifications without going outside the scope or theme of the present invention determined by the description of the scope of the patent claims. Accordingly, the description of the present invention aims to provide merely an exemplary description, and is not to be construed as limiting the present invention in any way.

What is claimed is:

1. A system for pattern data generation, comprising:
    a chip division information storage unit configured to register chip division information of a chip sub-pattern so that pattern data of enlarged reticle chip pattern data fit into a master mask pattern region;
    a chip layout generation unit configured to generate master mask chip layout information by sequentially allotting sub-patterns to a master mask in an order beginning with the largest from the plurality of sub-patterns configuring the chip division information;
    a master mask chip layout information storage unit configured to register the master mask chip layout information;
    a chip pattern data generation unit configured to generate master mask chip pattern data by referencing the reticle chip pattern data and divide each chip in accordance with the master mask chip layout information;
    a master mask pattern data information storage unit configured to register the master mask chip pattern data; and
    a pattern data generation unit configured to generate master mask pattern data by referencing the master mask chip layout information and the master mask chip pattern data.

2. The system of claim 1, further comprising:
    a pre-refine master mask pattern data storage unit configured to register pre-refine master mask pattern data; and
    a post-refined master mask pattern data storage unit configured to register post-refined master mask pattern data.

3. The system of claim 2, further comprising:
    a master mask pattern data storage unit configured to register master mask pattern data.

4. The system of claim 3, further comprising:
    a repeater control information storage unit configured to register a master mask identification number, the master mask region to be exposed, and exposure position information for a reticle for purposes of exposure generation of a reticle from a master mask with a photo-repeater device.

5. The system of claim 4, further comprising:
    a refined mask pattern unit configured to compare master mask pattern data registered in the master mask pattern data storage unit and pre-refine master mask pattern mask data registered in the pre-refine master mask pattern data storage unit for each master mask, extract only differing master mask pattern data from the master mask pattern data storage unit, and make this the pattern data for a refined mask.

6. The system of claim 5, further comprising:
    a processing mode determination unit configured to determine the processing mode for distinguishing either master mask pattern generation for a pre-designated initial mask or master mask pattern data generation for a refined mask.

7. A computer implemented method for pattern data generation comprising:
    generating chip division information by performing division processing of a chip pattern so that pattern data of enlarged reticle chip pattern data fit into a master mask pattern region;
    registering the chip division information in a chip division information storage unit;
    generating master mask chip layout information by sequentially allotting sub-patterns to a master mask in an order beginning with the largest from a plurality of sub-patterns configuring the chip division information;
    registering the master mask chip layout information in a master mask chip layout information storage unit;
    generating master mask chip pattern data by referencing the reticle chip pattern data and dividing each chip in accordance with the master mask chip layout data;
    registering the master mask chip pattern data in a master mask pattern data information storage unit; and
    generating master mask pattern data by referencing the master mask chip layout information and the master mask chip pattern data.

8. The computer implemented method of claim 7, further comprising:
    determining processing mode for distinguishing either master mask pattern generation for a pre-designated initial mask or master mask pattern data generation for a refined mask;
    in the case of refined mask processing mode, comparing the generated master mask pattern data and pre-refine master mask pattern data for each corresponding master mask, extracting only differing master mask pattern data, generating the master mask pattern data as a refined mask, and outputting as post-refined regenerated master mask pattern data.

9. The computer implemented method of claim 7, wherein the generating of master mask chip pattern data includes:
    reading in as input data each chip size of the reticle chip pattern data, dividing each chip pattern into the plurality of sub-patterns of pattern data where in the chip size is enlarged to become a size that fits the master mask pattern region, and generating the chip division information;
    rearranging the chip division information according to sub-pattern size, and storing the resulting chip division information in the chip division information storage unit;
    sequentially reading out the chip division information beginning with the largest sub-pattern from the chip division information storage unit, and allocating to the master mask; and
    in the case where there is blank region including the dummy region in the master mask after allocating a first sub-pattern to the master mask, reading out the next largest sub-pattern as a candidate from the chip division information storage unit, and attempting to allocate it to the blank region; and in the case where it cannot completely fit in to the blank region, reading out the next largest subsequent sub-pattern as a candidate from the chip division information storage unit, and attempting to allocate it to the blank region.

10. The computer implemented method of claim 9 wherein
a reticle correlating to the input data is a 4× magnified reticle.

11. The computer implemented method of claim 9 wherein
the generating of the chip division information includes generating the chip division information by dividing each chip pattern into the plurality of sub-patterns of 5× magnified pattern data, which is the reticle chip pattern data that has been subjected to 5× magnification to reach a size that falls within the master mask pattern region.

12. The computer implemented method of claim 9 wherein
allocating to the master mask includes storing the chip division information in the chip division information storage unit after rearranging based on the sub-pattern surface area, width and height so it may be sequentially read out beginning with the largest sub-pattern.

13. A computer program product for controlling a pattern data generation system, the program product comprising:
a command for generating chip division information by dividing a chip pattern into a plurality of sub-patterns so that pattern data of enlarged reticle chip pattern data fit into a master mask pattern region;
a command for registering the chip division information in a chip division information storage unit;
a command for generating master mask chip layout information by sequentially allotting sub-patterns to a master mask in an order beginning with the largest from the plurality of sub-patterns;
a command for registering the master mask chip layout information in a master mask chip layout information storage unit;
a command for generating master mask chip pattern data by referencing the reticle chip pattern data and dividing each chip in accordance with the master mask chip layout data;
a command for registering the master mask chip pattern data in a master mask pattern data information storage unit; and
a command for generating master mask pattern data by referencing the master mask chip layout information and the master mask chip pattern data.

14. The computer program product of claim 13, wherein
the command for generating master mask chip pattern data comprises
a sub-command for reading in as input data, each chip size of the reticle chip pattern data, and generating the chip division information by dividing each chip pattern into the plurality of sub-patterns of pattern data where in the chip size is enlarged to achieve a size that fits the master mask pattern region;
a sub-command for sequentially reading out the chip division information beginning with the largest sub-pattern from the chip division information storage unit and allocating to the master mask after rearranging according to sub-pattern size; and
a sub-command for, in the case where there is blank region including the dummy region in the master mask after allocating a first sub-pattern to the master mask, reading out the next largest sub-pattern as a candidate from the chip divided information storage unit, and attempting to allocate it to the blank region; and in the case where it cannot completely fit in the blank region, reading out the subsequently next largest sub-pattern as a candidate from the chip division information storage unit, and attempting to allocate it to the blank region.

15. A method for fabricating reticles comprising:
designing a planar pattern on the surface of a semiconductor chip;
determining chip pattern data for a necessary number of respective reticles for achieving a planar pattern upon the semiconductor chip;
generating chip division information by dividing a chip pattern into a plurality of sub-patterns so that pattern data of enlarged chip pattern data for the respective reticles fit into a master mask pattern region; generating master mask chip layout information by selecting a sub-pattern in an order beginning with the largest from the plurality of sub-patterns and sequentially allotting sub-patterns to a master mask; generating master mask chip pattern data by referencing the chip pattern data for the reticle and dividing each chip in accordance with the master mask chip layout data; generating master mask pattern data by referencing the master mask chip layout information and the master mask chip pattern data;
obtaining a plurality of master masks by respectively pattern a master mask upon a plurality of master mask substrates in accordance with the generated master mask pattern data by a pattern generator; and
generating the necessary number of respective reticles through the reduction/transcription of the master mask by an exposure system.

16. The method of claim 15, wherein
the respective reticles are each a 4× magnified reticle.

17. The method of claim 15, wherein
the expanded pattern data is a 5× magnified pattern data.

18. A method for manufacturing a semiconductor device comprising:
designing a planar pattern on the surface of a semiconductor chip;
determining chip pattern data for a necessary number of respective reticles for achieving
a planar pattern upon the semiconductor chip;
generating chip division information by dividing a chip pattern into a plurality of sub-patterns so that pattern data of enlarged chip pattern data for the respective reticles fit into a master mask pattern region; generating master mask chip layout information by selecting a sub-pattern in an order beginning with the largest of the plurality of sub-patterns and sequentially allotting sub-patterns to a master mask; generating master mask chip pattern data by referencing the chip pattern data for the reticle and dividing each chip in accordance with the master mask chip layout data; generating master mask pattern data by referencing the master mask chip layout information and the master mask chip pattern data;
obtaining a plurality of master masks by respectively patterning a master mask upon a plurality of master mask substrates in accordance with the generated master mask pattern data by a pattern generator;
generating the necessary number of respective reticles through the reduction/transcription of the master mask by an exposure system; and
forming a desired microscopic pattern upon a semiconductor substrate through a sequence of manufacturing steps including a selective diffusion step where a diffusion mask provided through photolithography step using one of the necessary number of reticles is used, and a selective etching step where an etch mask provided through photolithography using another one of the necessary number of reticles.

19. The method of claim 18, wherein the respective reticles are each a 4× magnified reticle.

20. The method of claim 18, wherein the expanded pattern data is a 5× magnified pattern data.

* * * * *